United States Patent [19]
Takeda et al.

[11] Patent Number: 5,737,281
[45] Date of Patent: Apr. 7, 1998

[54] DATA WRITING METHOD AND DEVICE OF SEMICONDUCTOR DEVICE

[75] Inventors: Minoru Takeda; Yutaka Hayashi; Machio Yamagishi, all of Kanagawa, Japan

[73] Assignee: Sony Corporation, Japan

[21] Appl. No.: 611,083

[22] Filed: Mar. 5, 1996

[30] Foreign Application Priority Data

Mar. 7, 1995 [JP] Japan .................... 7-046878

[51] Int. Cl.⁶ .................. G11B 13/00; G11C 11/34
[52] U.S. Cl. ........................... 369/14; 365/114
[58] Field of Search ................ 369/14, 15; 365/103, 365/106, 114

[56] References Cited

U.S. PATENT DOCUMENTS

| | | | |
|---|---|---|---|
| 4,469,527 | 9/1984 | Sugano et al. | 148/15 |
| 5,387,106 | 2/1995 | Mackenzie et al. | 434/271 |
| 5,444,651 | 8/1995 | Yamamoto et al. | 365/108 |

Primary Examiner—Tan Dinh
Attorney, Agent, or Firm—Ronald P. Kananen

[57] ABSTRACT

An ultraviolet laser beam emitted from a laser beam source 1 is subjected to on/off control at an AOM 3, is linearly scanned at an equal speed by a polygon mirror 5 and an fΘ lens 6, is collected by an object lens 7, and is selectively spot-irradiated to a memory cell array of a semiconductor chip 8 on an XY stage 9 two-dimensionally moved by a control device 10 so as to write a pattern corresponding to desired data, whereby a custom ROM can be supplied in flexible production on a timely basis meeting market trends.

6 Claims, 4 Drawing Sheets

DATA WRITING METHOD AND DEVICE OF SEMICONDUCTOR DEVICE

BACKGROUND OF THE INVENTION

1. Field of the Invention

The present invention relates to a data writing method and a data writing device of a semiconductor device having a nonvolatile metal oxide semiconductor (MOS) type configuration.

2. Description of the Related Art

One type of random access memory (ROM) made of a semiconductor memory of nonvolatile MOS transistors operating mainly for reading is a fixed ROM, i.e., a so-called "mask ROM", which is fabricated by incorporating the data desired by the user into the mask to be used during the wafer manufacturing step of the ROM so as to perform the programming during this wafer manufacturing step. At present, mainly large capacity mask ROMs have been used for the supply of software for games, i.e., so-called "game software".

To write the desired data in a mask ROM as a pattern, an ion implantation step of injecting ions of impurities using an ion implantation mask corresponding to the pattern of this data is carried out. As a result, a pattern of data is written in the memory cell array, that is, the plurality of memory cells arranged in the form of a lattice, comprising the mask ROM. Next, an interconnection step and a passivation film-forming step etc. are performed so as to produce the finished mask ROM.

In the production of mask ROMs, the steps after the ion implantation step are steps during which the manufacturer makes the game software, that is, during which it tailors the ROMs in accordance with the game software. In actuality, however, it substantially produces the ROMs on an anticipatory basis, so when a piece of game software does not turn out to be popular and sales do not grow, it is left holding a large inventory. Conversely, where the game software turns out to be very popular and the inventory runs out, the so-called turn around time (TAT), that is, the time it takes the manufacturer from receiving the data from the user to writing the patterns and delivering the products, is close one month, so there is a drawback such that the manufacturer cannot adequately deal with the trends of the market.

Another type of ROM for game software is a ROM using a compact disc (CD), i.e., the now attention-getting so-called CD-ROM. This CD-ROM features simple production steps in comparison with the semiconductor memory mask ROMs and enables production on order with a turn around time of about 1 week. However, this CD-ROM and the drive device for driving this CD-ROM have a considerably large size in comparison with a mask ROM and a device driving the mask ROM, so there is a problem of a lack of portability and a limited range of utilization.

OBJECT AND SUMMARY OF THE INVENTION

Therefore, in consideration with the above situation, the object of the present invention is to provide a data writing method and a data writing device of a semiconductor device which enable timely manufacturing of a semiconductor device mask ROM having a wide range of utilization and meeting the trends in the market.

The data writing method of a semiconductor device according to the present invention solves the above problem by performing writing of data by selectively spot-irradiating an ultraviolet laser beam to a memory cell array of a semiconductor device of a nonvolatile MOS type semiconductor configuration comprising a memory cell array and a peripheral control circuit.

The data writing device of a semiconductor device according to the present invention solves the above problem by comprising a laser beam source for emitting an ultraviolet laser beam, an optical means for spot-irradiating a laser beam obtained by collecting the ultraviolet laser beam from the laser beam source to a memory cell array of the semiconductor device, a movement control means for controlling the movement of the semiconductor device in two-dimensions, and a control means for driving the movement control means and controlling the on/off state of the laser beam from the optical means in accordance with the write data thereby to perform control for selectively irradiating the laser beam to the memory cell array, so as to write the data to the semiconductor device.

Here, when a wavelength of the ultraviolet laser beam is $\gamma$ and a gate length of one memory cell constituting the memory cell array is Lg, the following relationship is satisfied:

$$n\gamma > Lg (n=1 \text{ to } 1.5).$$

BRIEF DESCRIPTION OF THE DRAWINGS

These and other objects and features of the present invention will be more apparent from the following description of the preferred embodiments made with reference to the attached drawings, in which.

DETAILED DESCRIPTION OF THE PREFERRED EMBODIMENTS

Figure 1:
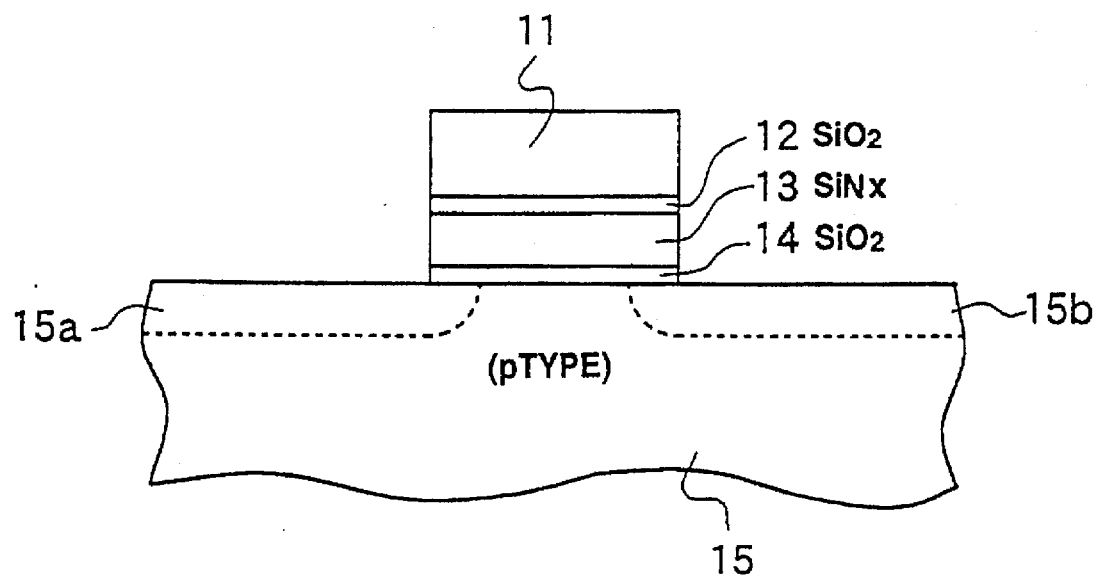
FIG. 1 is a schematic cross-sectional structural view of a memory cell of a semiconductor device of a metal oxide nitride oxide semiconductor (MONOS) configuration.

In the present invention, the writing of data is carried out by selectively spot-irradiating an ultraviolet laser beam to the memory cell array of the semiconductor device, so the writing of the data can be carried out with respect to the semiconductor device in the form of a package in the final step of the manufacturing of the semiconductor device.

Below, preferred embodiments of the present invention will be explained referring to the drawings. A semiconductor device to be used in the data writing method and the data writing device of the semiconductor device according to the present invention has a nonvolatile MOS transistor type semiconductor configuration. As this semiconductor device, a so-called MONOS configuration and a floating gate (hereinafter, referred to as an FG) configuration can be considered. Here, the schematic sectional configuration of a memory cell of a semiconductor device of the MONOS configuration is shown in FIG. 1, and a schematic sectional configuration of a memory cell of a semiconductor device of the FG configuration is shown in FIG. 2.

A memory cell of a mask ROM of a usual MOS transistor configuration is constituted by forming a source 15a of an n-type diffusion layer and a drain 15b of an n-type diffusion layer on a p-type Si substrate 15, forming a gate oxide film ($SiO_2$) in an upper portion of this Si substrate 15, stacking polycrystalline silicon (poly-Si) on the upper layer of this gate oxide film ($SiO_2$), and performing etching to form a gate electrode.

Figure 2:
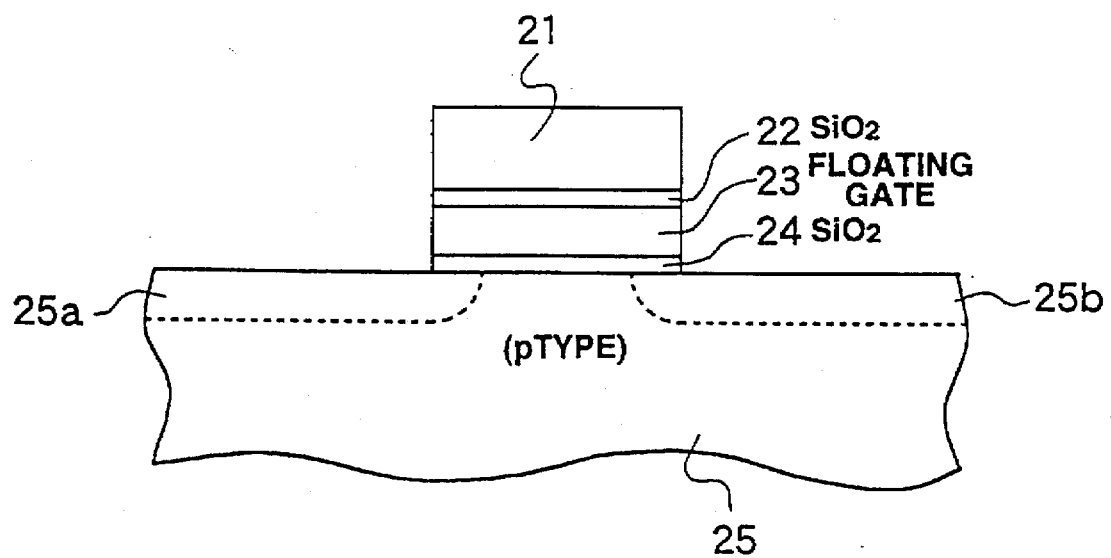
FIG. 2 is a schematic cross-sectional structural view of the memory cell of the semiconductor device of an FG configuration.

The memory cell of a semiconductor device of the MONOS configuration is obtained by a replacing the gate oxide film ($SiO_2$) of the usual MOS transistor configuration by a three-layer configuration of a gate oxide film ($SiO_2$) 14, a nitride film (SiNx) 13, and an oxide film ($SiO_2$) 12 in order from the Si substrate 15 side as shown in FIG. 1, and constituted by the formation of a gate electrode 11 on the oxide film ($SiO_2$) 12. The film thicknesses of the gate oxide film ($SiO_2$) 14, nitride film (SiNx) 13, and oxide film ($SiO_2$) 12 are set to 4 nm, 8 nm, and 2.5 to 3 nm, respectively.

In order to bring all the memory cells of a semiconductor device of the MONOS configuration to their initial state, electron injection is carried out by using a not illustrated peripheral control circuit. In this initial state, when a transistor operating voltage of 1 to 2V is applied to the gate electrode 11, a conductive state where a current flows through a channel of the transistor, that, an ON state, is exhibited.

Also, the memory cell of a semiconductor device of the FG configuration is constituted, as shown in FIG. 2, by forming a source 25a of ab n-type diffusion layer and a drain 25b of an n-type diffusion layer on a p-type Si substrate 25 by ion implantation, forming a gate oxide film ($SiO_2$) 24 in the upper portion of this Si substrate 25, and forming an FG 23 made of polycrystalline silicon, an oxide film ($SiO_2$) 22, and a control gate electrode 21 on the upper layer of this gate oxide film ($SiO_2$) 24 in order from this gate oxide film ($SiO_2$) 24 side.

In the initial state of all the memory cells of the semiconductor device of this FG configuration, a potential difference of 15 to 20V is applied between the FG 23 and the Si substrate 25 of the positive potential, and electrons are injected into the FG 23, electrons accumulate at a boundary surface between the FG 23 and the gate oxide film ($SiO_2$) 24, thereby to exhibit a state where the current does not flow through the channel of the transistor, that is, an OFF state.

Figure 3:
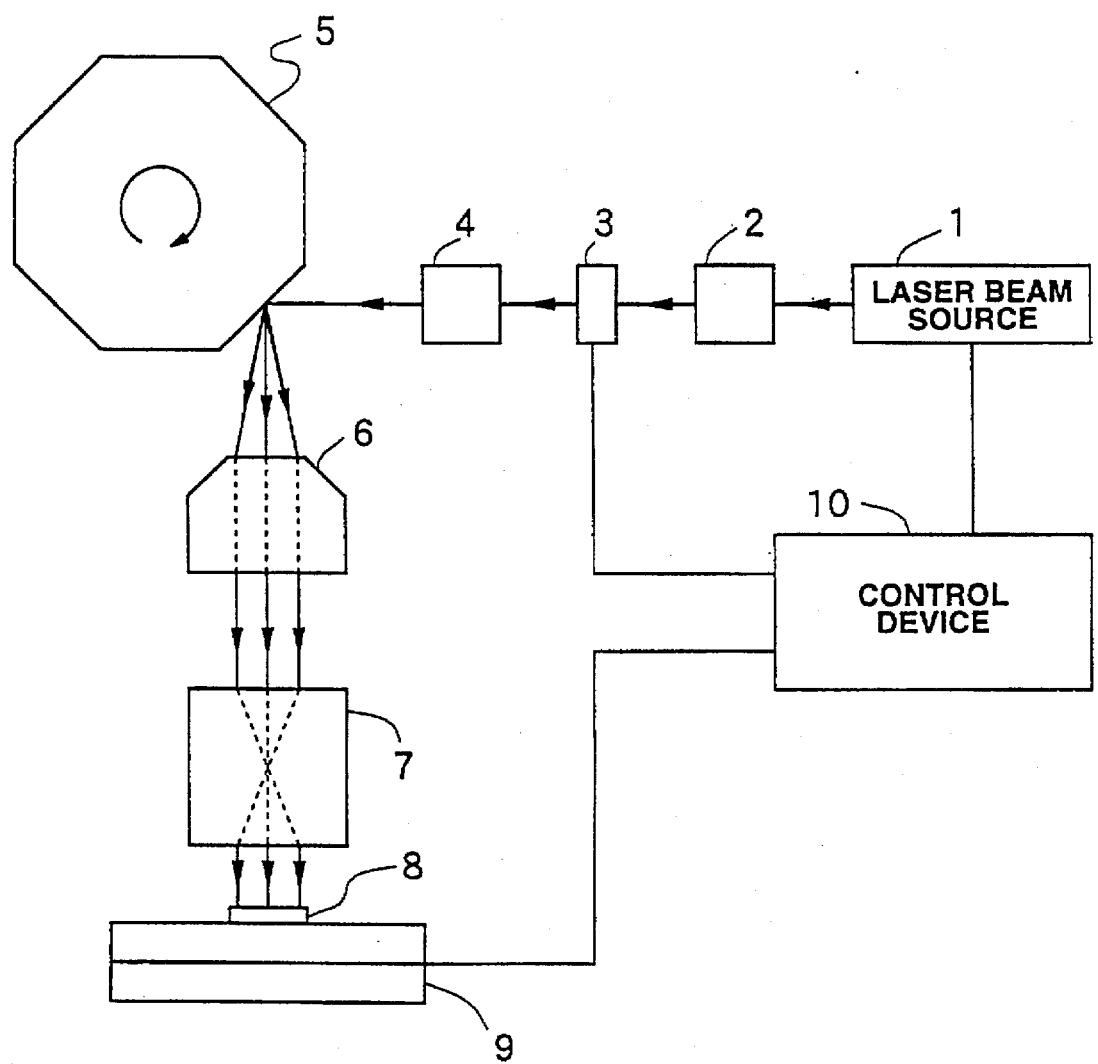
FIG. 3 is a schematic cross-structural view of a data writing device of the semiconductor device according to the present invention.

Next, a schematic configuration of an ultraviolet laser scanning device serving as the data writing device for writing the data in a semiconductor device of the MONOS configuration or the FG configuration as mentioned above is shown in FIG. 3.

This ultraviolet laser scanning device is constituted by a laser beam source 1 for emitting an ultraviolet laser beam, an optical means for spot-irradiating this ultraviolet laser beam to the memory cell array of a semiconductor chip 8, that is, the semiconductor device, an XY stage 9 serving as movement control means for moving the semiconductor chip 8, and a control device 10 serving as the control means for controlling the laser beam source 1, an acoustic optical modulator, i.e., a so-called AOM 3, and the XY stage 9. Also, the optical means comprises an AOM 3, which is a high speed electronic shutter, a polyhedron mirror, i.e., so-called a polygon mirror 5 which performs the deflection by reflecting the modulated ultraviolet laser beam, a fΘ lens 6 for linear scanning the laser beam deflected by this polygon mirror 5 at an equal speed, an object lens 7 for collecting the laser beam, and so on.

Using this ultraviolet laser scanning device, the spot of the ultraviolet laser beam is scanned over to the semiconductor device. The memory cell is selectively irradiated over the memory cell array so as to write the data.

Figure 4:
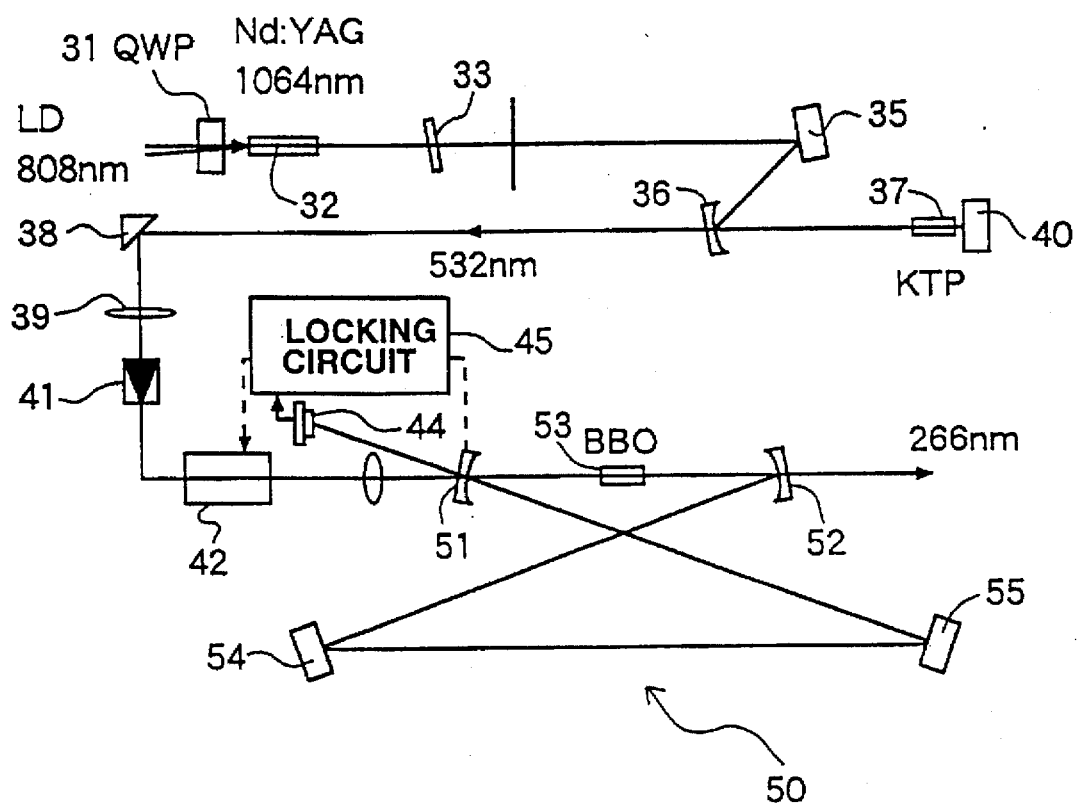
FIG. 4 is a schematic cross-structural view of an ultraviolet laser beam source.

In this data writing device, under the control of the control device 10 comprising a computer etc., an ultraviolet laser beam, i.e., a so-called UV laser beam, is emitted from the laser beam source 1. As this ultraviolet laser beam, use is made of a far-ultraviolet laser beam using for example a fourth high harmonic of an Nd:YAG laser which can be continuously oscillated. The concrete configuration of the laser beam source 1 for emitting the ultraviolet laser beam, that is, the laser beam source is shown in FIG. 4.

In this ultraviolet laser beam source, as the light source element for pumping a laser medium 32, a semiconductor laser element such as a not illustrated laser diode is used. A laser beam for pumping having a wavelength of 808 nm from this semiconductor laser element is emitted from the incident plane of a quarter wavelength plate (QWP) 31 upon the laser medium 32 using for example Nd:YAG.

The laser medium 32 is pumped by the laser beam of wavelength of 808 nm, and generates the basic wave laser beam of a wavelength of 1064 nm. Here, on the incident plane of the quarter wavelength plate 31, a reflection plane, i.e., so-called a dicloic mirror having a wavelength selectivity that allows the transmission of the laser beam for pumping and reflects the basic wave laser beam of a wavelength of 1064 nm generated in the laser medium 32 is formed.

The basic wave laser beam of the wavelength of 1064 nm generated by the laser medium 32 is adjusted in its output by a filter 33, reflected at a folded mirror 35, and then made incident upon a nonlinear optical crystal element 37 made of for example KTP via an output coupler 36, whereby second high harmonic generation (SHG) is carried out. The second high harmonic laser beam of a wavelength of 532 nm produced by the generation of this second high harmonic is reflected at a mirror 40, and then reflected at a mirror 58.

The laser beam reflected at the mirror 58 is made incident upon an optical isolator via a lens 39.

This optical isolator 41 #avoids# the return light of the incident second high harmonic laser beam to the laser element. The second high harmonic laser beam passing through this optical isolator 41 strikes an electro-optic phase converter (EOM) 42 where it is subjected to phase conversion. Namely, phase conversion is carried out on the far-ultraviolet laser beam which is output. This phase-converted second high harmonic laser beam strikes an external resonator 50.

The external resonator 50 is configured by providing, as a reflection means, a concave surface mirror 51, an output coupler 52, and reflection mirrors 54 and 55. Also, in the light path of this external resonator 50, a wavelength conversion element 53 comprised by a nonlinear optical crystal such as, for example BBO is arranged. By this, in this external resonator 50, generation of the fourth high harmonic is carried out, and a far-ultraviolet laser beam having a wavelength of 266 nm is generated.

Also, in this external resonator 50, a voice coil motor (VCM) is used in order to perform the positioning of the upper concave surface mirror 51. The position of the concave surface mirror 51 is controlled by this VCM, thereby to enable a fine change of the light path length in the external resonator 50.

Concretely, the second high harmonic laser beam incident upon the concave surface mirror 51 is sent to a light detector 44 and detected. The detection signal from this light detector 44 is sent to a #locking# circuit 45. The VCM is driven by this #locking# circuit 45, whereby the position of the concave surface mirror 51 is controlled.

By this, the resonance frequency of the external resonator 50 is controlled, the second high harmonic laser beam is pulled into the external resonator 50 with a high efficiency, and a far-ultraviolet laser beam can be stably generated. Also, in the #locking# circuit 45, control of the phase modulation of the electro-optic phase converter 42 is carried out.

The ultraviolet laser beam emitted from the laser beam source 1 is a continuously oscillatable laser beam. This continuously oscillatable ultraviolet laser beam is collected by the lens 2 and controlled to turn on and off by the AOM 3. This on/off-controlled laser beam is split to a collimate beam by the lens 4, made incident upon a facet of the rotary polyhedron mirror performing high speed rotation at an equal speed, i.e., a so-called polygon mirror 5, and deflected.

The deflected laser beam is corrected so as to perform linear scanning by the fΘ lens 6, that is, the scan (scanning) lens. By this, the laser beam which was corrected so as to perform equal speed linear scanning is focused to a spot size of a diameter of about 1 m on the semiconductor chip 8 by the object lens 7.

Here, the semiconductor chip 8 is placed on the XY stage 9 controlled for precision movement and the XY stage 9 is driven by the control device 10. Also, the control device 10 controls the output of the ultraviolet laser beam emitted from the laser beam source 1 and controls the on and off state of the laser beam by the AOM 3.

By this, the light spot of the collected laser beam is scanned over the semiconductor chip 8, that is, the semiconductor device of the MONOS configuration or FG configuration, to selectively irradiate the memory cells corresponding to a desired data pattern through a transparent package window of the memory cells of the semiconductor device, whereby the data is written.

Figure 5:
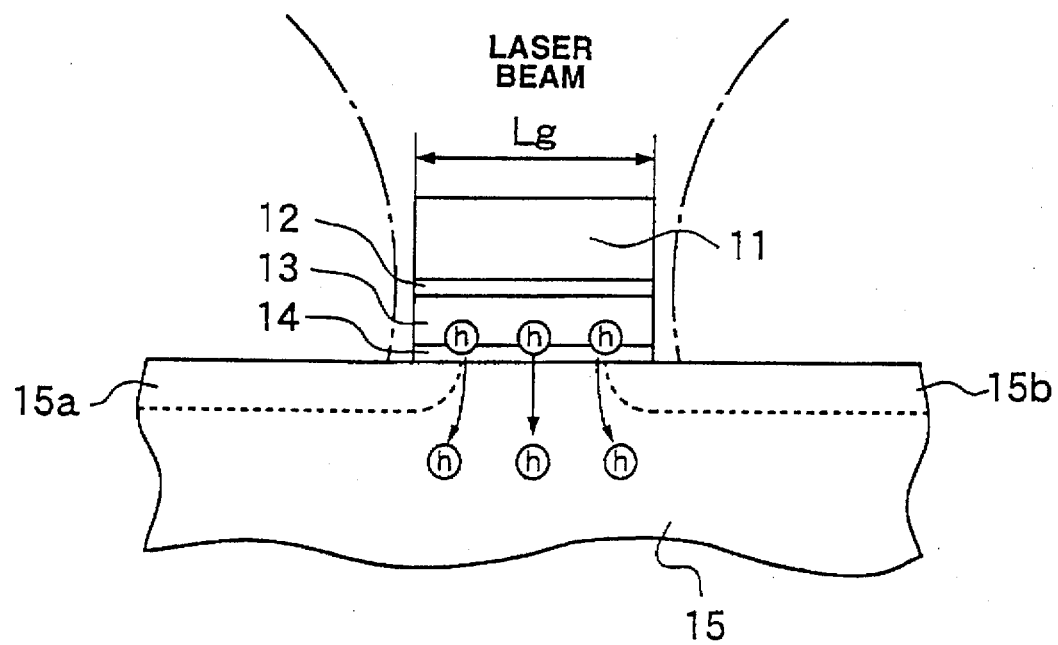
FIG. 5 is a view explaining the discharge of positive holes in a memory cell of the semiconductor device of the NONOS configuration.

More specifically, as shown in FIG. 5, when the ultraviolet laser beam is spot-irradiated to the memory cells of the semiconductor device of the MONOS configuration shown in FIG. 1, due to the diffraction effect, a part of the ultraviolet rays goes arounds the boundary between the gate oxide film ($SiO_2$) 14 of the lower portion of the gate electrode 11 and the nitride film (SiNx) 18, whereby the positive holes (positive charges) indicated by h are produced. These positive holes h are discharged to the Si substrate 15 side over a potential barrier of 2 to 3 eV existing between the gate oxide film ($SiO_2$) 14 and the nitride film (SiNx) 12. By this, in a state where the positive holes of boundary of the gate oxide film ($SiO_2$) 14 and the nitride film (SiNx) 12 are reduced, even if the transistor operating voltage of 1 to 2V is applied to the gate electrode 11, a nonconductive state where the current does not flow through the channel of the transistor, that is, the OFF state, is exhibited.

In this way, the data pattern is written in the memory cell array of the semiconductor chip 8 by changing the transistors to an OFF state only for the desired memory cells.

At this time, if assuming that the wavelength of the ultraviolet laser beam emitted from the laser beam source 1 is γ and the gate length of the MOS transistor constituting the memory cell is Lg, by satisfying a relationship of nγ>Lg (n=1 to 1.5), a spot irradiation where positive holes almost uniformly go around into the gate oxide film ($SiO_2$) 14 can be carried out.

Figure 6:
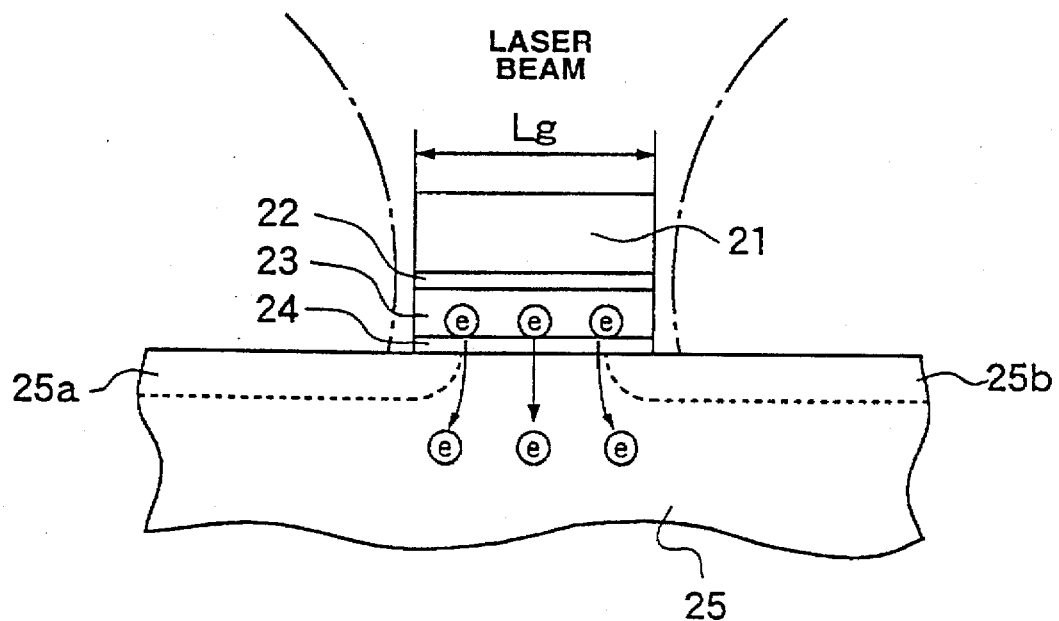
FIG. 6 is a view explaining the discharge of electrons in a memory cell of the semiconductor device of the FG configuration.

Also, as shown in FIG. 6, when the ultraviolet laser beam is spot-irradiated to the memory cells of a semiconductor device of the FG configuration shown in FIG. 2, electrons (negative electric charges) indicated by c, accumulated a the boundary between the FG 23 and the gate oxide film ($SiO_2$) 24, are discharged, whereby the data pattern is written in the memory cell array of the semiconductor chip 8.

Here, a memory cell on which the ultraviolet laser beam is irradiated has no accumulated electrons, so when a transistor operating voltage of for example 3.3V is applied to the control gate electrode 21, a conductive state where the current flows through the channel of the transistor, that is, the ON state, is exhibited. That is, the on/off state of the transistor of the memory cell before or after the writing of the data of the semiconductor device of am FG configuration becomes reverse to the on/off state of the transistor of the memory cell before or after the writing of the data of the semiconductor device of the MONOS configuration.

In this way, the pattern of the data of the manufacturing serial number is written by changing the transistors to the ON state only for the desired memory cells.

Further, in a semiconductor device of this FG configuration, similar to the case of a semiconductor device of the MONOS configuration, if assuming that the wavelength of the ultraviolet laser beam emitted from the laser beam source 1 is γ and the gate length of the MOS transistor constituting the memory cell is Lg, by satisfying a relationship of nγ>Lg (n=1 to 1.5), spot irradiation where the electrons almost uniformly go around into the gate oxide film ($SiO_2$) 24 can be carried out.

The data can be taken out from a semiconductor device mask ROM in which a data pattern is written by an ultraviolet laser scanning device in this way by using a data reading and fetching peripheral circuit etc. This taken out data is stably held for a long period by accumulated charges or accumulated electrons.

Note that, in the embodiment, an explanation was made of a case where an ultraviolet laser beam of a fourth high harmonic of a semiconductor laser was used as the ultraviolet laser beam when writing the data pattern by the data writing device of the semiconductor device, but it is possible for the laser beam source to be used in the data writing device of the semiconductor device according to the present invention to be any laser beam source from which an continuously produced ultraviolet laser beam is emitted and it is possible to use another laser beam source.

As apparent from the above explanation, in the data writing method of the semiconductor device according to the present invention, by writing data by selectively spot-irradiating an ultraviolet laser beam over the memory cell array of a semiconductor device of a nonvolatile MOS type semiconductor configuration comprising a memory cell array and a peripheral control circuit, the pattern of the data is written on the semiconductor device of the nonvolatile MOS type semiconductor configuration comprising the memory cell array and the peripheral control circuit when all of the manufacturing steps have been ended and the device is packaged, so there is almost no overhead of the manufacturing steps as in the conventional mask ROMs and a semiconductor device can be manufactured by a simple process. Also, the peripheral control circuit for bringing the memory cell into the initial state by injecting electrons to all memory cells can be made much simpler compared with the conventional control circuit for the injection of electrons, and the space occupied by this peripheral control circuit can be reduced, so the entire size of the semiconductor chip can be further reduced and the capacity of the memory can be increased by that amount.

Also, since the data writing device of the semiconductor device according to the present invention comprises a laser beam source for emitting the ultraviolet laser beam, an optical means for spot-irradiating a laser beam obtained by collecting the ultraviolet laser beam from the laser beam source to the memory cell array of the semiconductor device, a movement control means for controlling the movement of the semiconductor device in two dimensions, and a control means for driving the movement control means and controlling the on/off state of the laser beam from the optical means in accordance with the write data so as to selectively irradiate the laser beam to the memory cell array so as to write the data to the semiconductor device, the data can be written in the semiconductor device in an extremely short period, so custom ROMs can be supplied in flexible production of products meeting market trends.

What is claimed is:

1. A data writing method of a semiconductor device, wherein writing of data is carried out by selectively spot-irradiating an ultraviolet laser beam to a memory cell array of a selectively movable semiconductor device of a non-volatile MOS type semiconductor configuration comprising a memory cell array and a peripheral control circuit for controlling movement of said semiconductor device.

2. A data writing method of a semiconductor device as set forth in claim 1, wherein when a wavelength of the ultraviolet laser beam is 2 and a gate length of one memory cell constituting the memory cell array is Lg, the following relationship is satisfied:

$$n\gamma > Lg (n=1 \text{ to } 1.5).$$

3. A data writing device of a semiconductor device, comprising:

a laser beam source for emitting an ultraviolet laser beam, an optical means for spot-irradiating a laser beam obtained by collecting the ultraviolet laser beam from the laser beam source to a memory cell array of the semiconductor device, a movement control means for controlling the movement of the semiconductor device in two-dimensions, and a control means for driving the movement control means and controlling the on/off state of the laser beam from the optical means in accordance with the write data thereby to perform control for selectively irradiating the laser beam to the memory cell array, so as to write the data to the semiconductor device.

4. A data writing device as set forth in claim 3, wherein, when the wavelength of the ultraviolet laser beam is γ and the gate length of one memory cell constituting the memory cell array is Lg, the following relationship is satisfied:

$$n\gamma > Lg (n=1 \text{ to } 1.5).$$

5. The data writing device of claim 3, wherein said optical means comprises a rotating polyhedron mirror for reflecting the laser beam from said laser beam source toward the semiconductor device.

6. The data writing device of claim 5, wherein said optical means further comprises a scan lens for receiving the laser beam from said polyhedron mirror and scanning the laser beam at an equal speed; and and an object lens for collecting the laser beam from said scan lens.

* * * * *